United States Patent
Wang

(10) Patent No.: US 8,665,019 B2
(45) Date of Patent: Mar. 4, 2014

(54) POWER AMPLIFIER

(71) Applicant: Realtek Semiconductor Corp., Hsinchu (TW)

(72) Inventor: Po-Chih Wang, Kaohsiung (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/967,406

(22) Filed: Aug. 15, 2013

(65) Prior Publication Data

US 2013/0328630 A1    Dec. 12, 2013

Related U.S. Application Data

(63) Continuation of application No. 13/176,343, filed on Jul. 5, 2011, now Pat. No. 8,536,942.

(30) Foreign Application Priority Data

Jul. 6, 2010 (TW) ................................ 99122247 A

(51) Int. Cl.
*H03F 3/45* (2006.01)
(52) U.S. Cl.
USPC .......................................... 330/253; 330/285
(58) Field of Classification Search
USPC .................. 330/252–261, 149, 285, 296; 375/296–297
See application file for complete search history.

(56) References Cited

U.S. PATENT DOCUMENTS

| 4,994,761 | A | 2/1991 | Craft |
| 7,622,992 | B2 | 11/2009 | Liu |
| 7,656,229 | B2 | 2/2010 | Deng et al. |
| 7,696,822 | B2 | 4/2010 | Wang |
| 8,203,384 | B1 * | 6/2012 | Thiagarajan et al. ......... 330/253 |
| 8,264,276 | B2 * | 9/2012 | Huang et al. .................. 330/253 |
| 2009/0153248 | A1 | 6/2009 | Sun et al. |
| 2009/0315621 | A1 | 12/2009 | Narathong et al. |

FOREIGN PATENT DOCUMENTS

| TW | 200810347 A | 2/2008 |
| TW | 200937852 A | 9/2009 |

OTHER PUBLICATIONS

TW Office Action dated Apr. 17, 2013.
Saleh, Aam, et al.; "Improving the Power-Added Efficiency of FET Amplifiers Operating with Varying-Envelope Signals;" IEEE Transactions on Microwave Theory and Techniques; vol. 31, No. 1, Jan. 1983; pp. 51-56.

* cited by examiner

*Primary Examiner* — Hieu Nguyen
(74) *Attorney, Agent, or Firm* — McClure, Qualey & Rodack, LLP

(57) ABSTRACT

A power amplifier is provided. The power amplifier includes a loading circuit, a first stage amplifying circuit, an analog pre-distorter, a loading circuit and a second stage amplifying circuit. The first stage amplifying circuit is coupled to the loading circuit to receive a first signal and output a second signal accordingly. The analog pre-distorter is coupled to the first stage amplifying circuit to detect the envelope of the second signal and generates a third signal according to the envelope. The second stage amplifying circuit is coupled to the first stage amplifying circuit to receive the second signal. The loading circuit is biased on the third signal. The gain of the first stage amplifying circuit is related to the third signal.

2 Claims, 5 Drawing Sheets

POWER AMPLIFIER

CROSS-REFERENCE TO RELATED APPLICATION

The present invention is a continuation of U.S. application Ser. No. 13/176,343, filed Jul. 5, 2011, which claims the benefit of Taiwan application Serial No. 99122247, filed Jul. 6, 2010, the subject matter of which is incorporated herein by reference.

BACKGROUND OF THE INVENTION

1. Field of the Invention

The invention relates in general to a power amplifier, and more particularly to a power amplifier which increases linearity.

2. Description of the Related Art

In a communication system, due to the difference in the modulation of signals, the required specifications of the required power amplifiers are also different. In recent years, the wireless communication network is conformed to IEEE 802.11a/b/g protocol, and since the orthogonal frequency-division multiplexing (OFDM) modulation used in the wireless communication network is similar to the amplitude modulation (AM), a power amplifier with higher linearity is thus required. In general, the power amplifier with high linearity increases the linearity through class A or class AB biasing, but the resulted power efficiency is lower. However, in order to further improve the communication quality, it is necessary to increase the linearity of the power amplifier.

SUMMARY OF THE INVENTION

According to an object of the invention, a power amplifier with high linearity is provided.

According to another object of the invention, a power amplifier with large bandwidth dynamic biasing network is provided.

The invention provides a power amplifier which includes a loading circuit, a first stage amplifying circuit, an analog pre-distorter, a loading circuit and a second stage amplifying circuit. The first stage amplifying circuit is coupled to the loading circuit to receive a first signal and output a second signal accordingly. The analog pre-distorter is coupled to the first stage amplifying circuit to detect the envelope of the second signal and generate a third signal according to the envelope. The second stage amplifying circuit is coupled to the first stage amplifying circuit to receive the second signal. The loading circuit is biased on the third signal. The gain of the first stage amplifying circuit is related to the third signal.

The invention provides another power amplifier which includes a first stage amplifying circuit, an envelope detector, a second stage amplifying circuit and a convertor. The first stage amplifying circuit receives a first signal and outputs a second signal accordingly. The envelope detector detects the envelope of the second signal and outputs the envelope of the second signal as a third signal. The primary side of the convertor is coupled to the first stage amplifying circuit. The secondary side of the convertor is coupled to the second stage amplifying circuit and biased on the third signal. The gain of the second stage amplifying circuit is related to the third signal.

The above and other aspects of the invention will become better understood with regard to the following detailed description of the preferred but non-limiting embodiment(s). The following description is made with reference to the accompanying drawings.

DETAILED DESCRIPTION OF THE INVENTION

First Embodiment

Figure 1:
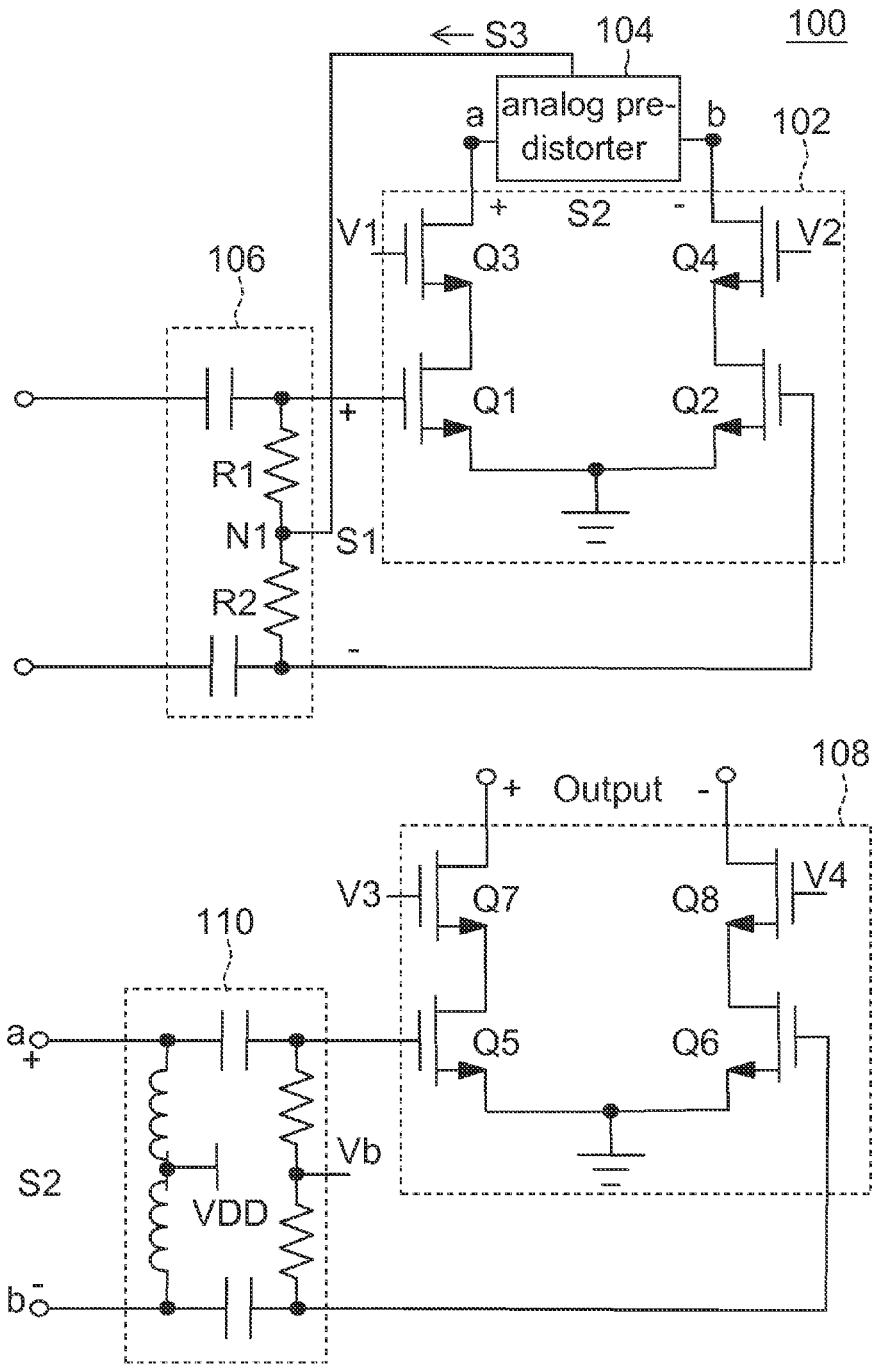
FIG. 1 shows a circuit diagram of a power amplifier according to a first embodiment of the invention.

Referring to FIG. 1, a circuit diagram of a power amplifier according to a first embodiment of the invention is shown. The power amplifier 100 includes a first stage amplifying circuit 102, an analog pre-distorter 104, a loading circuit 106 and a second stage amplifying circuit 108. The first stage amplifying circuit 102 is coupled to the two ends of the loading circuit 106 to receive a first signal S1 and outputs a second signal S2 accordingly.

The analog pre-distorter 104 is coupled to the first stage amplifying circuit 102 to detect the envelope of the second signal S2 and output a third signal S3 according to the envelope of the second signal S2. The loading circuit 106 is coupled to the first stage amplifying circuit 102, wherein the node N1 of the loading circuit 106 is biased on the third signal S3, so that the gain of the first stage amplifying circuit 102 is related to the third signal S3. The second stage amplifying circuit 108 is coupled to the first stage amplifying circuit 102 to receive the second signal S2 and generate an output signal Output accordingly.

Figure 2:
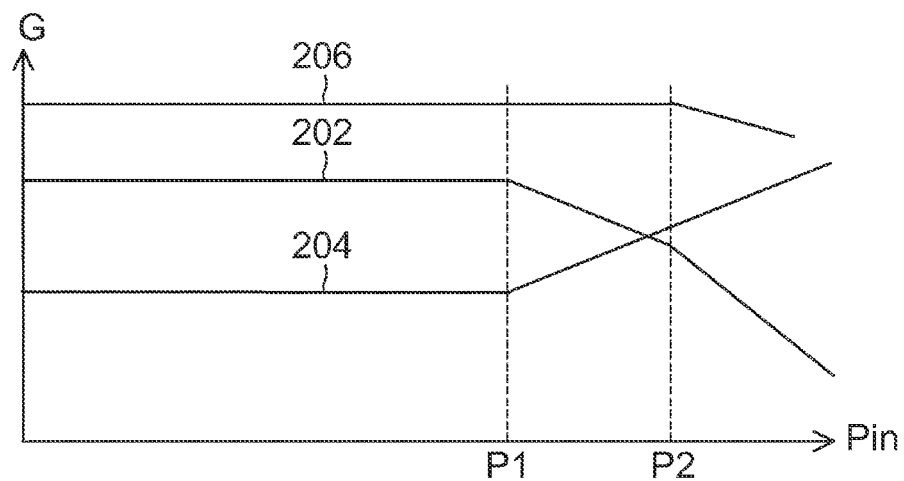
FIG. 2 shows respective gain curves of the first stage amplifying circuit, the second stage amplifying circuit and the power amplifier of FIG. 1 different levels of input power Pin.

The power amplifier of FIG. 1 is further elaborated below. Referring to FIG. 2, respective gain curves 202, 204 and 206 of the first stage amplifying circuit 102, the second stage amplifying circuit 108 and the power amplifier 100 of FIG. 1 under different levels of input power Pin are shown. The curves 202, 204 and 206 respective denote the gains of the second stage amplifying circuit 108, the first stage amplifying circuit 102 and the power amplifier 100 under different levels of input power. The second stage amplifying circuit 108 normally used as the last stage amplifier provides the largest power to next stage circuit and outputs a signal with the largest swing, and is therefore most likely distorted.

For example, as indicated in curve 202, when the power inputted to the second stage amplifying circuit 108 is larger than a predetermined value P1, the maximum of the output voltage is restricted by the DC supply voltage, so that the gain of the second stage amplifying circuit 108 gradually decreases. When the power inputted to the second stage amplifying circuit 108 is larger than a predetermined value P2, the output power of the second stage amplifying circuit 108 will be saturated, so that the gain of the second stage amplifying circuit 108 will decrease further. Thus, if only the second stage amplifying circuit 108 is used as a power amplifier, the linear region will be limited to the region under the predetermined value P1.

According to the present embodiment of the invention, the first stage amplifying circuit 102 dynamically adjusts the gain to compensate the decreased gain of the second stage amplifying circuit 108 so as to maintain the level of the gain of the power amplifier 100 and increase the linearity of the power amplifier 100. As indicated in the curve 204 of FIG. 2, when the power inputted to the first stage amplifying circuit 102 is larger than predetermined value P1, the gain of the second stage amplifying circuit 108 gradually decreases but the gain of the first stage amplifying circuit 102 gradually increases. Thus, the power amplifier 100 has a wider range of constant gain and superior linearity. As indicated in the curve 206 of FIG. 2, the overall gain of the power amplifier 100 maintains at a constant before the input power is larger than the predetermined value P2. In other words, the power amplifier 100 has a wider range of constant gain than the second stage amplifying circuit 108 has.

To achieve the above effect, the invention is implemented by way of adjusting the gain by changing the bias voltage of the first stage amplifying circuit 102. In the present embodiment of the invention, the first stage amplifying circuit 102 is implemented by several metal-oxide-semiconductor field-effect transistor (MOSFETs), and the gates of the transistors Q1 and Q2 are as input ends, for example. In FIG. 1, the two nodes designated by "a" denote the same node, and so do the two nodes designated by "b" denote the same node. Since the loading circuit 106 is biased on the third signal S3 and the DC bias voltages at the gates of the transistors Q1 and Q2 are related to the third signal S3, the gain of the first stage amplifying circuit 102 is thus related to the third signal S3. The loading circuit 106, which may include resistors or inductors, is implemented by resistors R1 and R2 and capacitors in the present embodiment of the invention. The resistors R1 and R2 are connected in serial and are respectively connected between the two gates of the transistors Q1 and Q2. The third signal S3 is inputted to the node N1 between the resistors R1 and R2. When the voltage volume of the third signal S3 changes, the DC bias voltages at the gates of the transistors Q1 and Q2 also change so as to change the transconductance gm of the transistors Q1 and Q2. Thus, the gain of the first stage amplifying circuit 102 changes accordingly.

In the present embodiment of the invention, the transistor power amplifier 100 further includes a matching circuit 110 disposed between the first stage amplifying circuit 102 and the second stage amplifying circuit 108, wherein the matching circuit 110 has the function of low-pass filtering. The matching circuit 110 includes two inductors biased by the DC voltage VDD, two resistors biased by the DC voltage Vb, and two capacitors respectively disposed between a resistor and an inductor. The second stage amplifying circuit 108 also includes several MOSFETs Q5~Q8. In the present embodiment of the invention, the gates of the transistor Q5 and Q6 are used as input ends which receive the second signal S2 outputted from the matching circuit 110.

Figure 3:
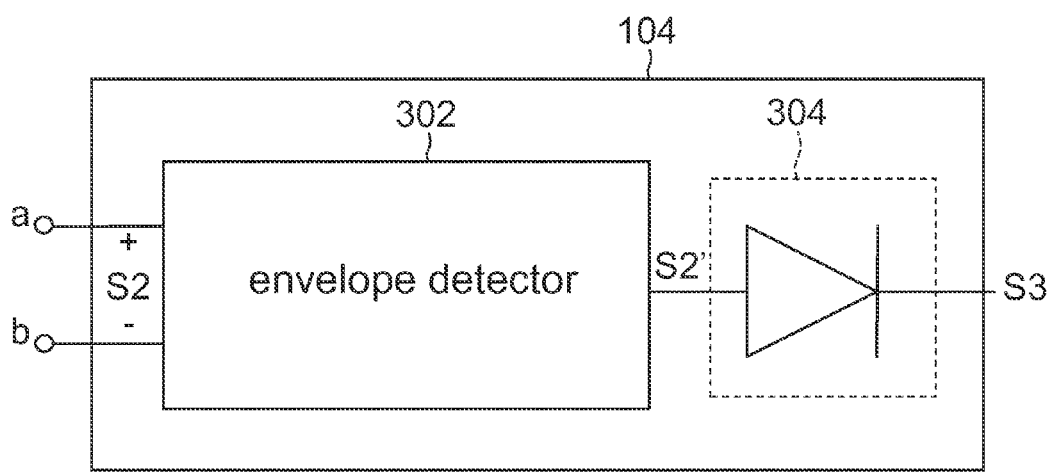
FIG. 3 shows an example of an analog pre-distorter.
Figure 4:
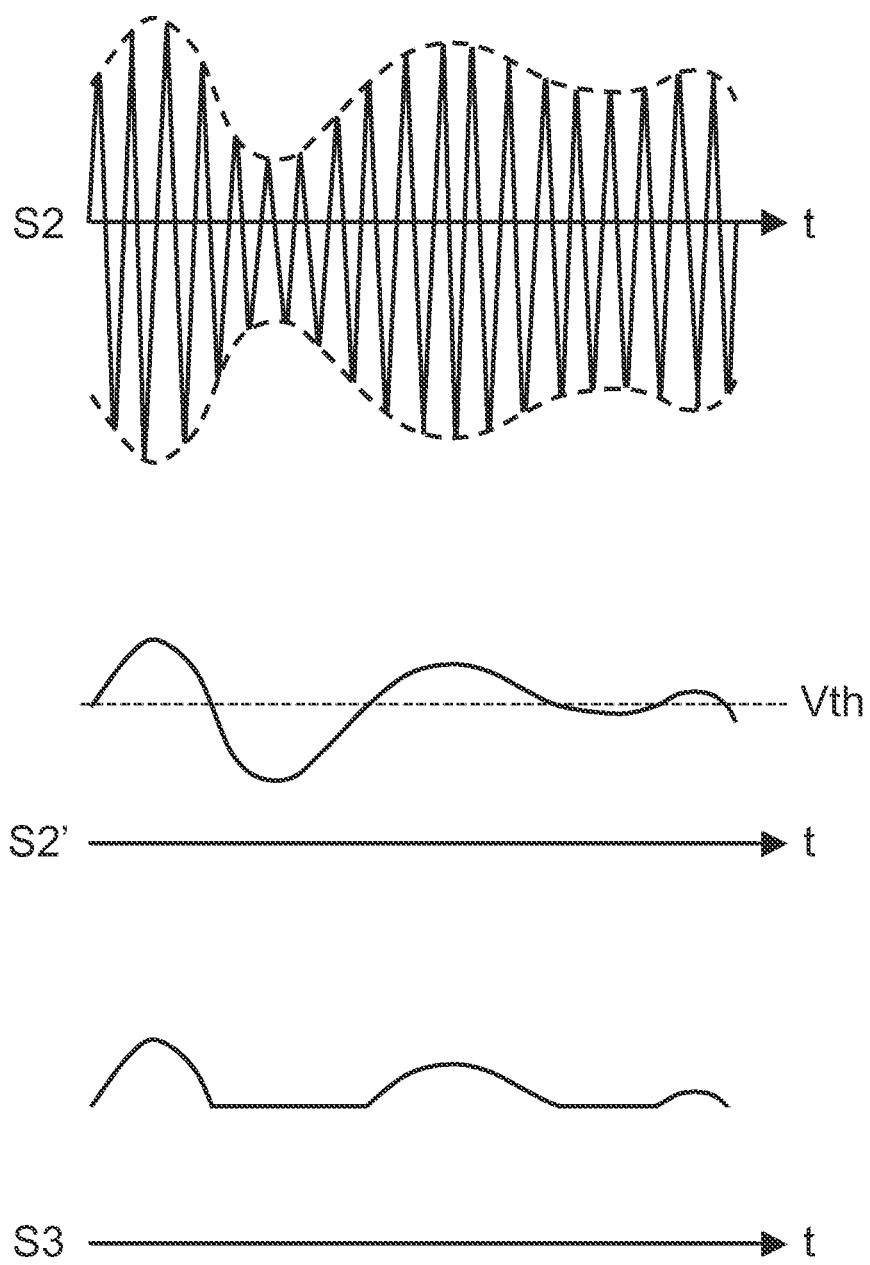
FIG. 4 shows an example of respective wave-pattern of a second signal S2, a signal S2' outputted by an envelope detector and a third signal S3.

Referring to FIG. 3, an example of an analog pre-distorter 104 is shown. The analog pre-distorter 104 includes an envelope detector 302 and a waveform shaping circuit 304. Referring to FIG. 4, an example of respective wave-pattern of a second signal S2, a envelop signal S2' outputted by an envelope detector and a third signal S3 is shown. The envelope detector 302 detects the envelope of the second signal S2, and generates the envelope signal S2' according to the envelope of the second signal S2. The waveform shaping circuit 304 receives the envelope signal S2' and outputs the part of the envelope of the second signal S2 larger than the threshold voltage Vth as the third signal S3. That is, the part of the envelope signal S2' larger than the threshold voltage Vth is sampled, the sampled signal (the part of the envelope signal S2' larger than the threshold voltage Vth) is outputted as the third signal S3. The threshold voltage Vth is related to the predetermined value P1 indicated in FIG. 2. Preferably, the voltage value corresponding to the predetermined value P1 is used as the threshold voltage Vth.

In the present embodiment of the invention, the waveform shaping circuit 304 is implemented by diodes. The number of diodes included in the waveform shaping circuit 304 and the turn-on voltages (cut-in voltage or diode forward voltage drop) of the diodes are determined according to the threshold voltage Vth. Thus, when the voltage of the output signal S2' is smaller than the overall cut-in voltage of the at least one diode, the current will not flow through the at least one diode, so that the third signal S3 maintains at a fixed level. Meanwhile, the DC bias voltages at the gates of the transistors Q1 and Q2 maintain at the fixed level, so that the gain of the first stage amplifying circuit 102 maintains at a constant level. When the voltage of the output signal S2' is larger than the overall cut-in voltage of the at least one diode, the current will flow through the at least one diode, so that the third signal S3 varies with the envelope signal S2'. Meanwhile, the DC bias voltages at the gates of the transistors Q1 and Q2 vary with the third signal S3, so that the gain of the first stage amplifying circuit 102 also varies with the third signal S3 so as to increase the range of constant gain created by the power amplifier 100 and increase the linearity of the power amplifier 100.

The above embodiment is exemplified for the description of an exemplary embodiment, not for limiting the invention. Anyone who is skilled in the field of the invention will understand the implementation of the power amplifier according to the description of the embodiment, and the details are not repeated here. The first stage amplifying circuit 102 and the second stage amplifying circuit 108 can also be realized by other types of amplifying circuits capable of adjusting the gain by dynamically changing the bias voltage of the first stage amplifying circuit 102, and are not limited to the illustration in FIG. 1.

Second Embodiment

Apart from the exemplification in the first embodiment, the increase in the linearity of the power amplifier can also be achieved by changing the gain of the second stage amplifying circuit.

In a power amplifier with dynamic biasing circuit, an envelope detector receives the signal outputted from the first stage amplifying circuit and corresponding generates package signal of the output signal. A matching circuit is biased on the package signal, so that the bias voltage of the input end of the second stage amplifying circuit varies with the package signal so as to dynamically adjust the gain of the second stage amplifying circuit.

However, since the matching circuit has several capacitors and resistors, so that the signal inputted to the input end of the second stage amplifying circuit delays and decays. Thus, the gain of the second stage amplifying circuit cannot be promptly and dynamically adjusted as the package signal changes, so that the linearity of the power amplifier is affected. To reduce the influence on the capacitors and resistors, the matching circuit implemented by several capacitors and resistors is replaced by a convertor in the present embodiment of the invention.

Figure 5:
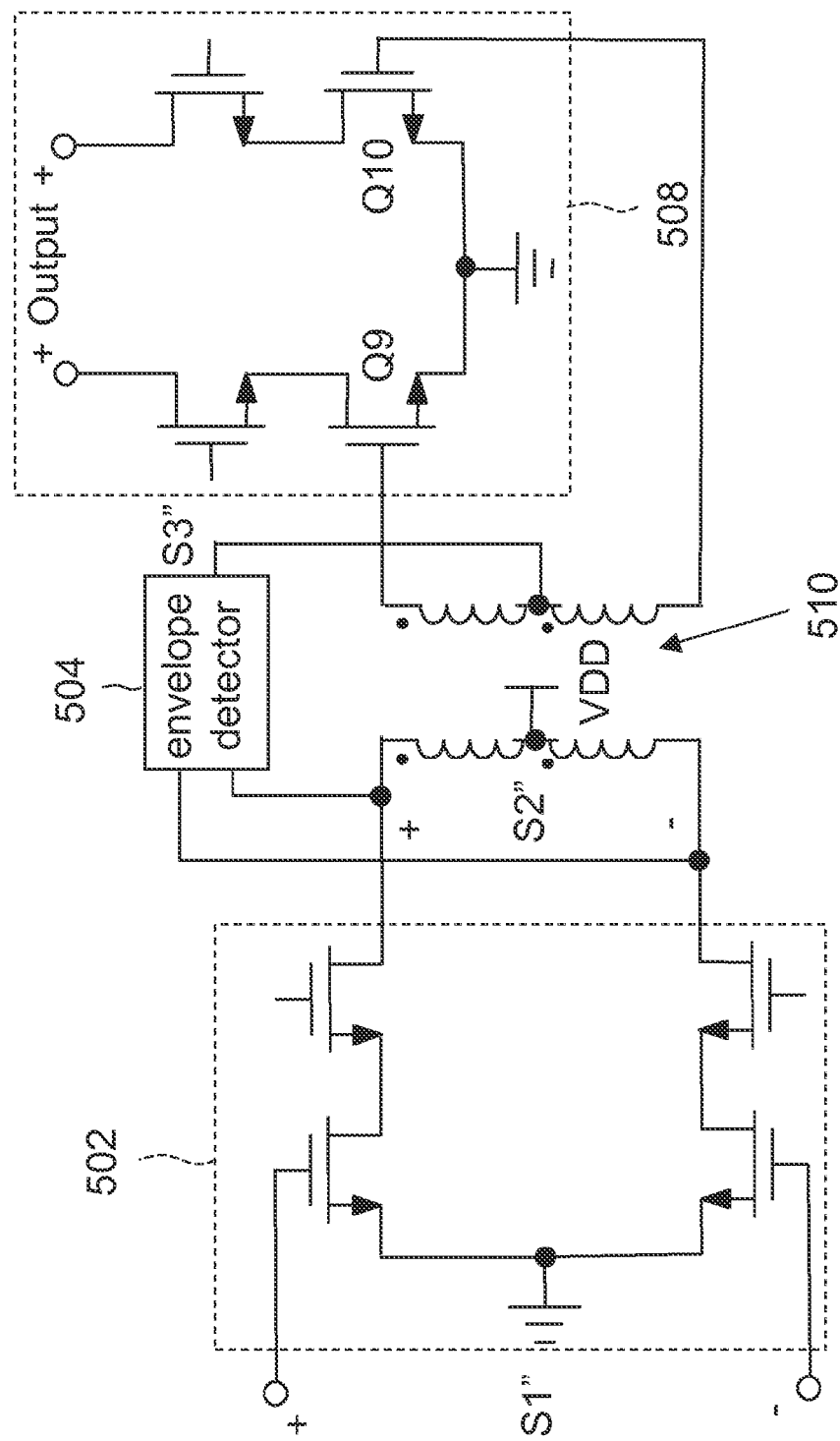
FIG. 5 shows a circuit diagram of a power amplifier according to a second embodiment of the invention.

Referring to FIG. 5, a circuit diagram of a power amplifier according to a second embodiment of the invention is shown. The power amplifier 500 includes a first stage amplifying circuit 502, an envelope detector 504, a second stage amplifying circuit 508 and a convertor 510. The first stage amplifying circuit 502 receives a first signal S1" and outputs a second signal accordingly S2". The envelope detector 504 detects the envelope of the second signal S2" and outputs the envelope of the second signal S2" as a third signal S3". The primary side of the convertor 510 is coupled to the first stage amplifying circuit 502, and the secondary side of the convertor 510 is coupled to the second stage amplifying circuit 508. The secondary side of the convertor 510 is biased on the third signal S3". The gain of the second stage amplifying circuit 508 is related to the third signal S3".

The second stage amplifying circuit 508 includes several metal-oxide-semiconductor field-effect transistor (MOSFETs). At least one input end is the gate of at least one of the transistors, such as the gate of the transistors Q9 and Q10. The DC bias voltages at the gates of the transistors Q9 and Q10 are related to the third signal S3", so that the gain of the second stage amplifying circuit 508 is related to the third signal S3".

Since the convertor has very small equivalent capacitance and equivalent resistance, the corresponding RC constant is also very small. Thus, when the voltage of the third signal S3" changes, the gates of the transistors Q9 and Q10 will change promptly without delay or distortion. Thus, the gain of the second stage amplifying circuit 508 is promptly and dynamically adjusted, the linearity of the power amplifier 500 is effectively increased and communication quality is improved.

Third Embodiment

Figure 6:
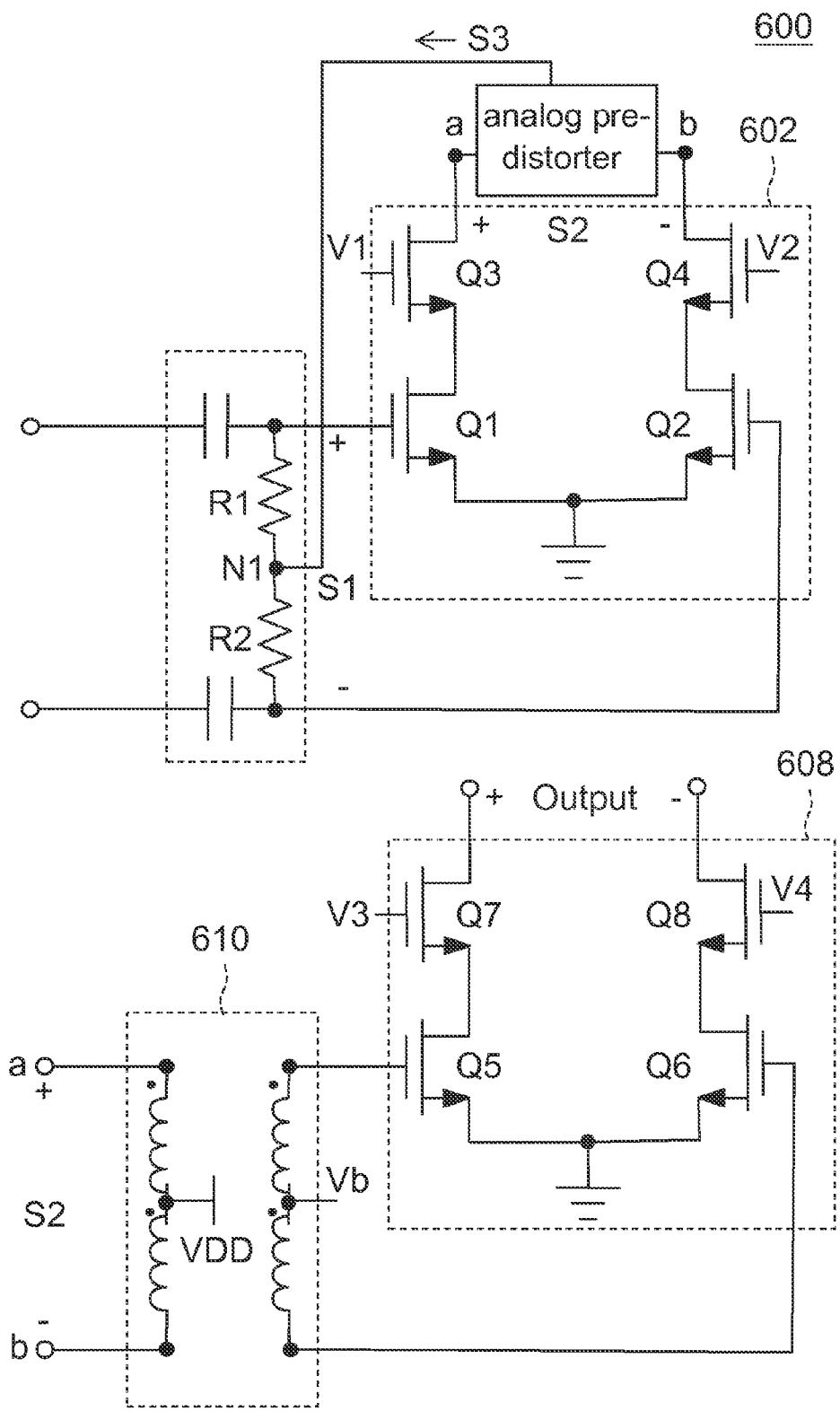
FIG. 6 shows a circuit diagram of a power amplifier according to a third embodiment of the invention.

The convertor 510 can also be used in the power amplifier 100 of FIG. 1. FIG. 6 shows a circuit diagram of a power amplifier 600 according to a third embodiment of the invention. The primary side of the convertor 610 is coupled to the first stage amplifying circuit 602 whose secondary side is coupled to the second stage amplifying circuit 608. Likewise, the third embodiment has the advantage of fast operation in addition to the advantages of the first embodiment.

Fourth Embodiment

The difference between the fourth embodiment and the first embodiment of the invention relies on that the power amplifier of the fourth embodiment is coupled to a loading circuit, and the power amplifier includes a first stage amplifying circuit, an analog pre-distorter, and a second stage amplifying circuit. The first stage amplifying circuit is coupled to the loading circuit to receive a first signal and output a second signal accordingly. The analog pre-distorter is coupled to the first stage amplifying circuit to detect the envelope of the second signal and generate a third signal according to the envelope. The second stage amplifying circuit coupled to the first stage amplifying circuit to receive the second signal. The loading circuit is biased on the third signal, and the gain of the first stage amplifying circuit is related to the third signal. The fourth embodiment has similar advantages as the first embodiment.

While the invention has been described by way of example and in terms of the preferred embodiment(s), it is to be understood that the invention is not limited thereto. On the contrary, it is intended to cover various modifications and similar arrangements and procedures and the scope of the appended claims therefore should be accorded the broadest interpretation so as to encompass all such modifications and similar arrangements and procedures.

What is claimed is:

1. A power amplifier, comprising:
a first stage amplifying circuit, which receives a first signal and outputs a second signal accordingly;
an envelope detector, which detects the envelope of the second signal and outputs the envelope of the second signal as a third signal;
a second stage amplifying circuit; and
a convertor whose primary side is coupled to the first stage amplifying circuit and secondary side is coupled to the second stage amplifying circuit, the secondary side of the convertor being biased on the third signal;
wherein the gain of the second stage amplifying circuit is related to the third signal.

2. The power amplifier according to claim 1, wherein the second stage amplifying circuit comprises a plurality of MOSFET, the second stage amplifying circuit has at least one input end, the at least one input end is the gate of the at least one of the MOSFET, and the DC bias voltage of the at least one input end is related to the third signal, so that the gain of the second stage amplifying circuit is related to the third signal.

* * * * *